United States Patent
Ueda et al.

(10) Patent No.: US 8,711,460 B2
(45) Date of Patent: Apr. 29, 2014

(54) MOVING STRUCTURE AND MICRO-MIRROR DEVICE USING THE SAME

(75) Inventors: Hideki Ueda, Matsusaka (JP); Hiroshi Noge, Tokyo (JP); Kiyohiko Kawano, Kadoma (JP); Hiroaki Tachibana, Ibaraki (JP)

(73) Assignee: Panasonic Corporation, Osaka (JP)

( * ) Notice: Subject to any disclaimer, the term of this patent is extended or adjusted under 35 U.S.C. 154(b) by 556 days.

(21) Appl. No.: 13/001,217

(22) PCT Filed: Jun. 24, 2009

(86) PCT No.: PCT/JP2009/061528
§ 371 (c)(1),
(2), (4) Date: Jan. 31, 2011

(87) PCT Pub. No.: WO2009/157486
PCT Pub. Date: Dec. 30, 2009

(65) Prior Publication Data
US 2011/0170157 A1 Jul. 14, 2011

(30) Foreign Application Priority Data
Jun. 25, 2008 (JP) ................................ 2008-166581

(51) Int. Cl.
*G02B 26/08* (2006.01)
*E05F 1/08* (2006.01)

(52) U.S. Cl.
USPC .................. 359/224.1; 359/198.1; 359/199.1; 359/199.2; 310/309; 16/277

(58) Field of Classification Search
USPC .......... 359/198.1–199.4, 200.6–200.8, 221.2, 359/224.1–224.2; 310/309, 311, 328, 310/330–331, 36; 16/223, 277, 319, 320, 16/342, 366–367
See application file for complete search history.

(56) References Cited

U.S. PATENT DOCUMENTS

| | | | |
|---|---|---|---|
| 4,945,765 | A | 8/1990 | Roszhart |
| 2002/0113675 | A1 | 8/2002 | Kato et al. |
| 2002/0114053 | A1 | 8/2002 | Yasuda et al. |
| 2003/0007262 | A1 | 1/2003 | Tsuboi et al. |
| 2003/0227114 | A1 | 12/2003 | Jeong |
| 2004/0114246 | A1 | 6/2004 | Polinsky et al. |
| 2004/0228015 | A1 | 11/2004 | Tsuboi et al. |
| 2005/0046918 | A1 | 3/2005 | Yasuda et al. |
| 2005/0122602 | A1 | 6/2005 | Kamiya et al. |
| 2005/0134951 | A1 | 6/2005 | Mi et al. |
| 2005/0243396 | A1 | 11/2005 | Fujii et al. |
| 2006/0209378 | A1 | 9/2006 | Yasuda et al. |
| 2007/0242328 | A1 | 10/2007 | Yasuda et al. |
| 2008/0165409 | A1 | 7/2008 | Tsuboi et al. |
| 2008/0285109 | A1 | 11/2008 | Tsuboi et al. |

FOREIGN PATENT DOCUMENTS

| | | |
|---|---|---|
| JP | 2002-321196 | 11/2002 |
| JP | 2003-15064 | 1/2003 |
| JP | 2005-189825 | 7/2005 |
| JP | 2007-256554 | 10/2007 |

OTHER PUBLICATIONS

European Search Report, dated Dec. 5, 2012.

*Primary Examiner* — James Phan
(74) *Attorney, Agent, or Firm* — Greenblum & Bernstein, P.L.C.

(57) ABSTRACT

In a moving structure, stability of swing motion of a moving plate is increased by enhancing tensional rigidity or flexural rigidity while restraining torsion rigidity of the hinge units. The hinge units of ladder shape with honeycombed portions are formed by twin supporting rods and crosspieces bridged between the twin supporting rods so as to support the moving plate rotatably. The tensional rigidity or the flexural rigidity is increased while restraining the torsion rigidity of the hinge units by the honeycombed portions of the hinge units.

14 Claims, 8 Drawing Sheets

| Vibration Mode | Torsion | In-plane Translation | In-plane Turn | Out-of-plane Translation | Out-of-plane Turn |
|---|---|---|---|---|---|
| Straight Hinge | 75.5Hz | 640Hz | 754Hz | 3730Hz | 7005Hz |
| Ladder Hinge | 75.5Hz | 1409Hz | 1662Hz | 3913Hz | 7343Hz |

Resonance Frequency

FIG.10

MOVING STRUCTURE AND MICRO-MIRROR DEVICE USING THE SAME

TECHNICAL FIELD

The present invention relates to a moving structure which swings a moving plate pivoted by hinge units around a rotation axis, and a micro-mirror device for light scanning which scans light using the moving structure.

BACKGROUND ART

Conventionally, there are some optical instruments such as bar-code readers or projectors that a micro-mirror device is mounted thereon to scan light beams by swinging a moving plate to which a mirror is provided and reflecting the light beams incident to the mirror to desired direction exist. Such a micro-mirror device is one to which a miniature moving structure formed by so-called micro-machining technology is mounted, and a moving plate is held by a pair of beam shaped hinge units supported by circumferential frame unit. The moving plate receives driving forces such as magnetic forces or electrostatic forces, and swings with twisting the hinge units using the hinge units as a rotation axis.

Figure 4:
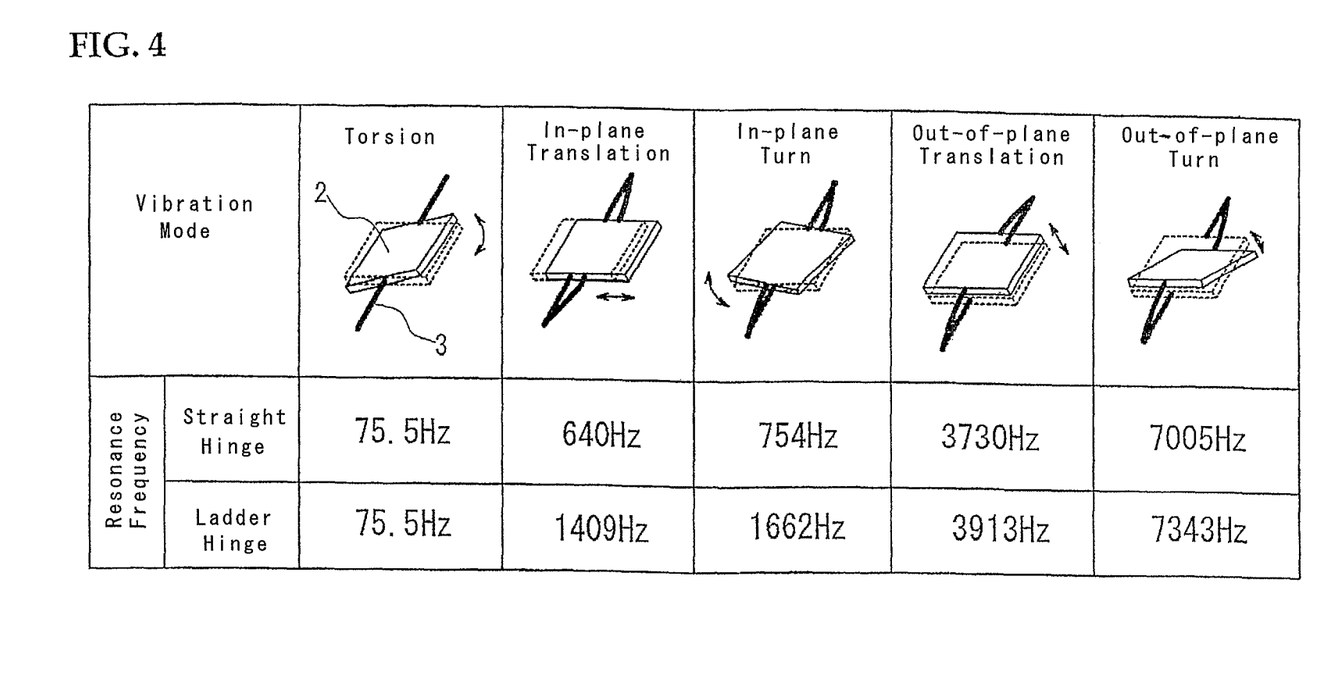
FIG. 4 is a table showing resonance frequencies of a moving plate in respective vibration modes calculated by simulation.

By the way, in the above mentioned moving structure, there are five kinds of "torsion mode", "in-plane translation mode", "in-plane turn mode", "out-of-plane translation mode" and "out-of-plane turn mode" in vibration modes of the moving plate, as shown in FIG. 4. In order to scan the light beams precisely, it is necessary to control the posture of the moving plate precisely, and it is demanded to increase response and stability of swing motion of the moving plate. In order to increase the response of the swing motion of the moving plate, it is necessary to design the hinge units to set the resonance frequency in the "torsion mode" to be lower than a constant level, so that various kinds of shapes which enable to reduce torsional rigidity of the hinge units are considered.

For example, a patent document 1 discloses a technology to form a cross-sectional shape of the hinge units to "X shape". In addition, a patent document 2 discloses a technology to form the hinge units by two supporting rods which are obliquely disposed to face each other with a space,

PRIOR ART DOCUMENTS

Patent Documents

Patent Document 1: JP 2002-321196A
Patent Document 2: JP 2003-15064A

SUMMARY OF INVENTION

Problems that the Invention is Going to Solve

In order to increase the stability of the swing motion of the moving plate mentioned above, it is effective to increase the resonance frequencies in the "in-plane translation mode", the "in-plane turn mode", the "out-of-plane translation mode" and the "out-of-plane turn mode", and thus, it is necessary to increase tensional rigidity and flexural rigidity of the hinge units sufficiently. However, in the technology shown in the above patent document 2, although it can restrain the torsional rigidity, on the other hand, the tensional rigidity and the flexural rigidity decrease simultaneously, so that it cannot increase the stability of the swing motion of the moving plate. In addition, the hinge units shown in the patent document 1 is not suitable for the optical instruments such as the bar-code readers or the projectors which are based on the premise of mass production because it is difficult to obtain the design objective rigidity characteristics due to complex manufacture processes and problems in processing precision.

The present invention is conceived in consideration of the above mentioned problems and purposed to provide a moving structure which enables to increase a quality of an image of an optical instrument or the like at a popular price by manufacturing the hinge units having desired rigidity characteristics in simple processes.

Means to Solve the Problems

For achieving the above mentioned purpose, disclosed herein is a moving structure comprising a moving plate, beam shaped hinge units which pivot the moving plate swingably, and a frame unit which supports the hinge units, wherein each of the hinge units has a ladder shape having twin supporting rods and crosspieces bridged between the twin supporting rods, and the twin supporting rods are not disposed in parallel with each other in planar view.

The twin supporting rods have no sides disposed in parallel with each other in planar view.

Upper faces and lower faces of the twin supporting rods and the crosspieces in thickness direction are respectively formed on the same levels as those of the moving plate.

The crosspieces are not disposed perpendicular to the supporting rods.

Each of the hinge units has a first end portion coupled to the moving plate and a second end portion coupled to the frame unit, and fillets are formed at coupling corners of the first end portion and the moving, plate and at coupling corners of the supporting rods and the frame unit.

Fillets are formed at coupling corners of the supporting rods and the crosspieces.

Each of the hinge units has a set of crosspieces, and the crosspieces are crossed and coupled each other between the twin support rods.

Each of the hinge units has a plurality of sets of crosspieces, and each set of the crosspieces are crossed at an angle different each other.

The twin support rods are formed as curved lines.
The curved lines are catenary curves.

Also disclosed is a micro-mirror device comprising the moving structure, and characterized in that the moving plate has a mirror for reflecting light, and electrodes for driving the moving plate swingably are provided on a mirror portion of the moving plate and a portion of the frame unit facing it.

Also disclosed is a micro-mirror device comprising the moving structure, and characterized in that the moving plate has a mirror for reflecting light, and electrodes for driving the moving plate swingably are provided on a part of the moving plate and a portion of the frame unit facing it to be perpendicular to the moving plate and in parallel with each other.

Effects of the Invention

Since the hinge units are formed as the ladder shape, it is possible to increase the tensional rigidity and the flexural rigidity of the hinge units sufficiently while restraining the torsional rigidity of the hinge units by honeycomb structure of the ladder. Thereby, it is possible to increase the response and stability of the swing motion of the moving plate, and to improve quality of images of an optical instrument easily and inexpensively. In addition, since the twin supporting rods are not disposed in parallel with each other, it is possible to increase the flexural rigidity of the hinge unit in concentrative, so that it is possible to restrain vibrations of the moving plate in the in-plane translation mode or in the in-plane turn mode, for example.

Since the twin supporting rods have no sides disposed in parallel with each other in planar view, it is possible to increase the flexural rigidity of the hinge unit in concentrative, so that it is possible to restrain vibrations of the moving plate in the in-plane translation mode or in the in-plane turn mode.

Since the twin supporting rods and the crosspieces are formed on the same level of the moving plate, the supporting rods and the crosspieces can be formed simultaneously when peripheral portion of the moving plate is removed by dry etching or the like. Thereby, the moving structure can be obtained by simple processes similar to those of the normal moving structure conventionally exists, and it is possible to improve the quality of images of the optical instrument more inexpensively.

Since the crosspieces are not disposed perpendicular to the supporting rods, it is possible to increase the tensional rigidity of the hinge unit in concentrative, so that it is possible to restrain vibrations of the moving plate in the modes other than in the torsion mode.

Since the fillets are formed in the first end portion and in the second end portion of the hinge unit, it is possible to disperse stresses acting on the first end portion and the second end portion. Thereby, it is possible to restrain occurrence of cracks in the first end portion and in the second end portion and to increase durability of the hinge unit furthermore, when the moving structure will be used for a long time.

Since the fillets are formed at the coupling corners of the supporting rods and the crosspieces, it is possible to disperse stress acting on the coupling corners. Thereby, it is possible to restrain occurrence of cracks at the above coupling corners and to increase durability of the hinge unit furthermore, when the moving structure will be used for a long time.

Since a set of the crosspieces are crossed and coupled each other between the twin support rods, it is possible to increase the flexibility to design the hinge units to have desired flexural rigidity and torsional rigidity, so that it is possible to restrain vibrations of the moving plate in the in-plane translation mode or in the in-plane turn mode effectively, for example.

Since each of the hinge units has a plurality of sets of the crosspieces, and each set of the crosspieces are crossed at an angle different each other, it is possible to increase the flexibility to design the hinge unit to have desired flexural rigidity and torsional rigidity. Thereby, it is possible to restrain vibrations of the moving plate in the in-plane translation mode or in the in-plane turn mode effectively, for example.

Since the support rods are formed as curved lines, it is possible to set the distribution of stresses acting on the supporting rods freely, so that the durability of the hinge unit can be increased moreover.

Since the supporting rods are formed as catenary curves, it is possible to distribute the stresses acting on the supporting rods more evenly, so that the durability of the hinge unit can be increased moreover.

It is possible to obtain the micro-mirror device superior to response and stability of the swing motion of the moving plate easily and inexpensively.

Since the twin supporting rods and the crosspieces are formed on the same level of the moving plate, and the electrodes for driving the moving plate swingably are provided perpendicular to the moving plate and in parallel with each other, it is possible to form the electrodes and the hinge units of ladder shape simultaneously by removing peripheral portion of the moving plate and the honeycombed portion of the hinge units by the same process such as dry etching. Thereby, the micro-mirror device superior to response and stability of the swing motion of the moving plate can be obtained more easily and inexpensively.

MODE FOR CARRYING OUT THE INVENTION

Figure 1:
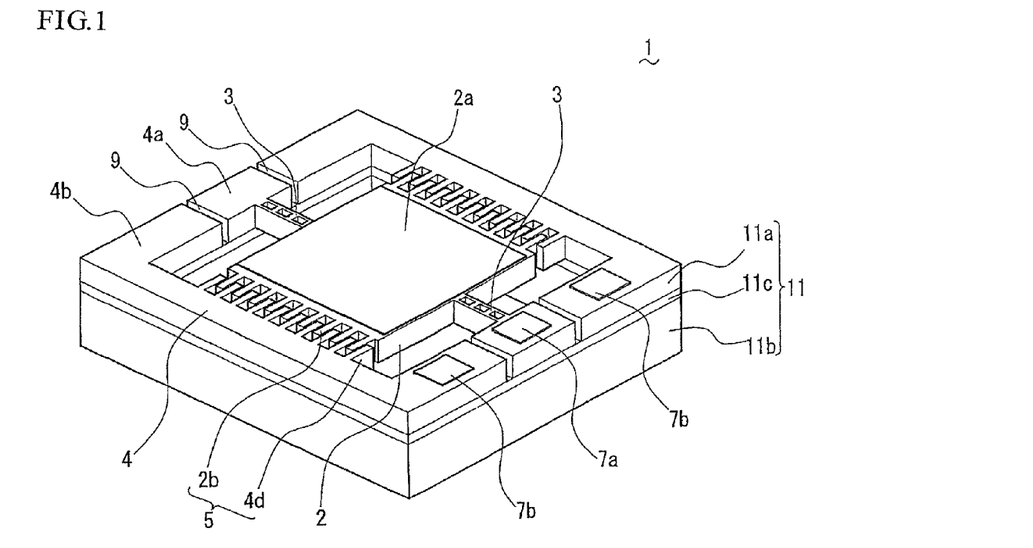
FIG. 1 is a perspective view showing an example of a micro-mirror device using a moving structure in accordance with a first embodiment of the present invention.
Figure 2:
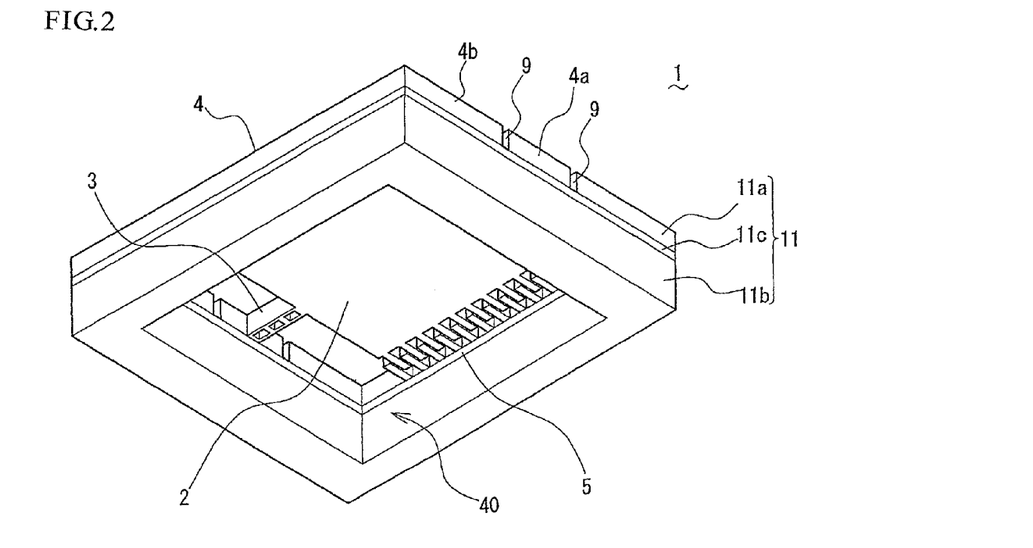
FIG. 2 is a perspective view of the mirror device observed from below.
Figure 3:
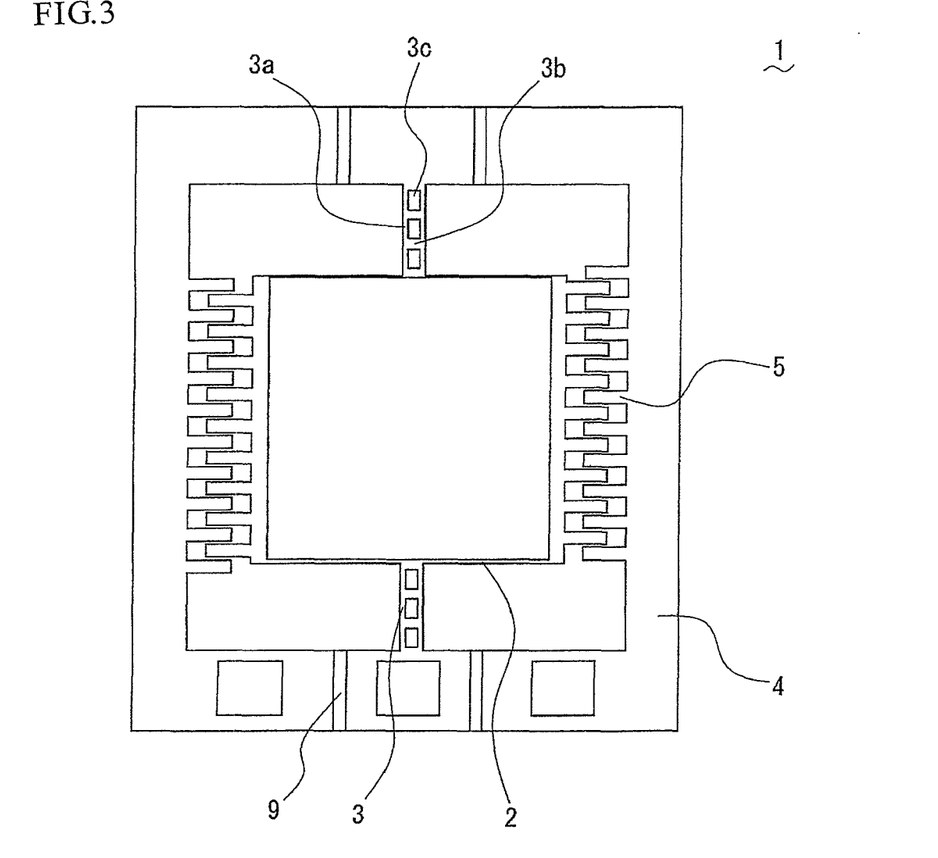
FIG. 3 is a plain view of the mirror device.

A micro-mirror device for light scanning which uses a moving structure in accordance with a first embodiment of the present invention will be described below. FIG. 1, FIG. 2 and FIG. 3 show an example of the micro-mirror device in accordance with this embodiment. The micro-mirror device (hereinafter, abbreviated as mirror device) 1 consists of a miniature moving structure which is formed by processing silicon layers with a manufacturing method utilizing so-called micro machining technology. The mirror device 1 is to be mounted on an optical instrument such as a bar-code reader, a projector apparatus which projects an image on an external screen, or a light switch, and has a function to scan light beams which are incident from external light source or the like (not shown in the figures).

The mirror device 1 is configured of a triple-layered SOI (Silicon on Insulator) substrate 11 which is joined a first silicon layer 11a and a second silicon layer 11b each having electro-conductivity via a silicon oxidation film (insulation film) 11c having insulation characteristics. A thickness of the SOI substrate 11 is about 400 [µm], and thicknesses of the first silicon layer 11a and the insulation film 11c are respectively about several tens [µm] and several [µm], for example. The mirror device 1 is a rectangular solid device that upper face is substantially square of about 4 [mm] in planar view, and mounted on the optical instrument by disposed on a glass substrate, for example.

A moving plate 2 which is formed to be a rectangular shape, for example, twin beam shaped hinge units 3 which are respectively disposed coaxial in both sides of the moving plate 2, and a frame unit 4 which holds a top end portion of each hinge unit 3 opposite to a region where the moving plate 2 is provided are integrally formed on the first silicon layer 11a. As shown in FIG. 2, a space 40 is formed in a region of the insulation film 11c and the second silicon layer 11b below the moving plate 2, and the moving plate 2 is swingably pivoted by the hinge units 3 and held on the frame unit 4. When the mirror device 1 is in a static state, that is, not driven, it is configured that top faces of the moving plate 2, the hinge units 3 and the frame unit 4 are aligned substantially flat.

The frame unit 4 is arranged to surround the moving plate 2. Perpendicular combs (comb tooth electrodes) 5 which generate driving forces of the moving plate 2 are formed on the moving plate 2 and the frame unit 4. Electrode pads 7a, 7b are formed on the top face of the frame unit 4 for applying driving voltages to the perpendicular combs 5.

An end of each hinge unit 3 is connected to a substantially central portion on both sides of the moving plate 2. Two hinge units 3 are formed substantially symmetrical with respect to the moving plate 2, so that they hold the moving plate 2 in a balanced manner. A center of gravity of the moving plate 2 is located in the vicinity of an axis that the two hinge units 3 serve. Therefore, the moving plate 2 is rotated around the hinge units 3 serving as the rotation axis while twisting the hinge units 3 when it is driven to swing by the perpendicular combs 5, so that it is swingable in a balanced manner. A mirror film (mirror) 2a of rectangular shape for reflecting light beams incident from outside, for example, is formed on the top face of the moving plate 2. The mirror film 2a is a metal film such as aluminum or gold which is selected corresponding to a kind of a light source used with the mirror device 1. In addition, the shapes of the moving plate 2 and the mirror film 2a are not limited to a rectangle, and, it may be a circle or an oval, for example.

The frame unit 4 has supporting portions 4a for supporting the hinge units 3, and two stationary electrode portions 4b which are disposed to surround two side end portions of the moving plate 2 which become free ends in swing motion and in which the perpendicular combs 5 are formed. The supporting portions 4a and the stationary electrode portions 4b are electrically insulated each other by insulation grooves 9 formed by removing the silicon layer 11a at boundaries of them, for example. The electrode pads 7a, 7b are respectively formed on the supporting portion 4a and the stationary electrode portions 4b, and it is configured that electric potentials of the supporting portions 4a and the stationary electrode portions 4b can be varied independently by changing electric potentials of the electrode pads 7a, 7b. The electrode pads 7a, 7b are formed of the same metal films as that of the mirror film 2a, for example.

The perpendicular combs 5 have electrodes 2b consisting of a plurality of comb tooth formed in the side end portions of the moving plate 2 which become free ends in swing motion, and electrodes 4d consisting of a plurality of comb tooth formed at regions of the stationary electrode portions 4b facing the side end portions of the moving plate 2. The perpendicular combs 5 are configured so that the electrodes 2b and 4d are arranged to engage with each other at a distance of several [μm], for example. In other words, the electrodes 2b and 4d are arranged perpendicular to the moving plate 2 but in parallel with each other.

The electrodes 2b are conducted to the electrode pad 7a via the supporting portion 4a, the hinge unit 3 and the moving plate 2. On the other hand, the electrodes 4d are conducted to the electrode pads 7b via the stationary electrode portions 4b. When a voltage is applied between the electrodes 2b and 4d in a posture that the moving plate 2 is a little slanted to the frame unit 4, that is, the state that the electrodes 2b and the electrodes 4d are discrepant in a direction perpendicular to the moving plate 2, attraction forces occur between respective electrodes 2b, 4d due to electrostatic forces, so that the moving plate 2 pivoted by the hinge units 3 is driven to rotate. In other words, an electrostatic torque around the hinge units 3 serving as the rotation axis acts on the moving plate 2 when the electrostatic force generated by the driving voltage applied to the perpendicular combs 5 acts on the moving plate 2 substantially perpendicularly, so that the moving plate 2 is driven to swing.

Subsequently, motion of the mirror device 1 configured above is described. The moving plate 2 of the mirror device 1 is driven by that the perpendicular combs 5 generates the driving forces at a predetermined driving frequency. The perpendicular combs 5 are driven by applying voltages of predetermined frequency between the electrodes 2b and 4d by frequently varying the electric potential of the electrode pads 7b disposed in the stationary electrode portions 4b under a state that the electrode pad 7a disposed in the supporting portion 4a is connected to a ground electric potential and the electrodes 2b of the moving plates 2 are in the reference electric potential. When electric potentials of the two electrodes 4d of the perpendicular combs 5 are varied to a predetermined driving electric potential (for example, several tens volts) simultaneously, the two electrodes 2b formed in both end portions of the moving plate 2 are attracted to the electrodes 4d facing them by electrostatic forces simultaneously. In this mirror device 1, it is configured that pulse voltages of rectangular waveforms are applied to the perpendicular combs 5 and the driving forces due to the perpendicular combs 5 are periodically generated, for example. In addition, the second silicon layer 11b is connected to the ground electric potential too, so that the moving plate 2 and the hinge units 3 are driven in a state to be the same electric potential, in this embodiment.

Generally, in many cases, the above mentioned moving plate 2 inclines a little not level in the static state due to internal stress generated in the shaping process. Therefore, even from the static state, when the perpendicular combs 5 are driven, the driving forces act on the moving plate 2 in a direction perpendicular to it, and thus, the moving plate 2 can rotate around the hinge units 3 serving as the rotation axis. Subsequently, even though the driving forces due to the perpendicular combs 5 are released when the moving plate 2 takes a posture that the electrodes 2b and 4d completely overlap, the moving plate 2 continues to rotate by its inertial force while twisting the hinge units 3. When the inertial force of the moving plate 2 in the rotation direction becomes equal to restoring forces of the hinge units 3, the rotation of the moving plate 2 in that direction stops. At this time, the perpendicular combs 5 are driven again, and the moving plate 2 starts to rotate in the opposite direction by the restoring forces of the hinge units 3 and the driving forces of the perpendicular combs 5. By repeating the rotations due to the driving forces of the perpendicular combs 5 and the restoring forces of the hinge units 3, the moving plate 2 is swung. The perpendicular combs 5 are driven by applying the voltages having a frequency two times as large as a resonance frequency of a vibration system configured by the moving plate 2 and the hinge units 3, and it is configured that the moving plate 2 is driven with resonance phenomenon to increase a swing angle thereof. In addition, since voltage application manner and the driving frequency of the voltage of the perpendicular combs 5 are not limited to the above, it is possible to be configured that the driving voltages are applied as sinusoidal waves. Furthermore, it is possible to be configured that electric potentials of the electrodes 2b and 4d vary in antiphase each other.

FIG. 4 shows vibration modes and resonance frequencies calculated by simulation of the moving plate 2 driven by perpendicular combs 5. Since the moving plate 2 is hung on the frame unit 4 through the hinge units 3, it is vibrated in "in-plain translation mode", "in-plane turn mode", "out-of-plane translation mode" and "out-of-plane turn mode" shown in FIG. 4 due to expansion and contraction transformation or bending transformation of the hinge units 3, further to rotation ("vibration in torsion mode") due to torsion transformation of the hinge units 3 around the rotation axis.

As mentioned above, since it is necessary to control the posture of the moving plate 2 precisely to scan the light beams precisely, it is required to increase response and stability of the swing motion of the moving plate 2. In order to increase the response of the swing motion of the moving plate 2, it is necessary to design the hinge units 3 so that the resonance frequency in the "torsion mode" to be equal to or smaller than a constant level, and it is effective to decrease the torsional rigidity of the hinge units 3. On the other hand, in order to increase the stability of the swing motion of the moving plate 2, it is necessary to increase the resonance frequencies in the "in-plain translation mode", "in-plane turn mode", "out-of-plane translation mode" and "out-of-plane turn mode", and it is effective to increase tensional rigidity and flexural rigidity of the hinge units 3 sufficiently. However, generally in order to increase the tensional rigidity and the flexural rigidity of the hinge units 3, the torsional rigidity of the hinge units 3 around the rotation axis is increased incidentally, consequently the response of the swing motion of the moving plate 2 is decreased.

Therefore, in the mirror device 1, the hinge units 3 are formed to have a ladder shape with honeycombed portions 3c as shown in FIG. 1 to FIG. 3 (it is described as "ladder hinge" in FIG. 4), so that the tensional rigidity and the flexural rigidity of the hinge units 3 are increased with assuring the torsional rigidity of the hinge units 3 similar to that of normal rod shaped hinges conventionally exist (it is described as "straight hinge" in FIG. 4).

Figure 5:
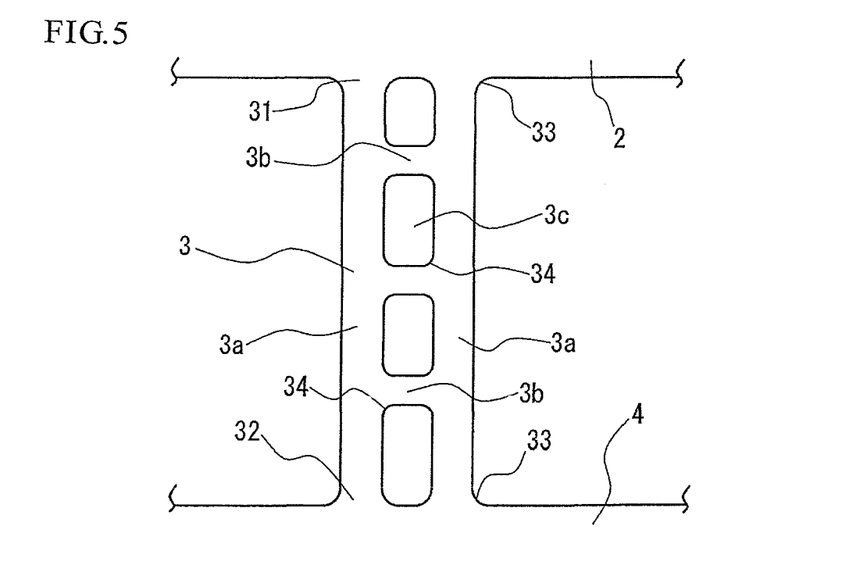
FIG. 5 is a plain view showing an enlarged hinge unit.

FIG. 5 shows an extended hinge unit 3. The hinge unit 3 has twin supporting rods 3a arranged in parallel with each other, and crosspieces 3b bridged between the twin supporting rods 3a, and the supporting rods 3a and the crosspieces 3b are formed in plane with the moving plate 2 to be the ladder shape in planar view. The supporting rod 3a is formed to have a width dimension of several [μm], a thickness dimension of several tens [μm] (which corresponds to a thickness dimension of the first silicon layer 11a), and a length dimension of several hundred [μm]. A distance between the supporting rods 3a is selected to be several [μm]. The crosspieces 3b are provided in a plural number, and respectively arranged substantially perpendicular to the supporting rods.

In the hinge units 3, spaces enclosed by the supporting rods 3a and the crosspieces 3b become the honeycombed portion 3c so as to restrain the torsional rigidity of the hinge units 3. In other words, the hinge units 3 have rigidity characteristics that it is transformable in torsional direction in particular due to existence of the honeycombed portions 3c. On the other hand, the rigidity characteristics of the hinge units 3 becomes hard to transform in tensional direction and in flexural direction due to the twin supporting rods 3a arranged with a distance and the crosspieces 3b combining them. By designing the supporting rods 3a and the crosspieces 3b properly in consideration with such rigidity characteristics, it is possible to increase the resonance frequencies in the "in-plain translation mode", "in-plane turn mode", "out-of-plane translation mode" and "out-of-plane turn mode" with assuring the resonance frequency in the "torsion mode" in the same level as that of the straight hinge, as shown in FIG. 4. According to the calculation shown in FIG. 4, the resonance frequencies in the "in-plain translation mode", "in-plane turn mode" can be increased dramatically in particular, so that an effect to restrain unnecessary vibrations of the moving plate 2 is expected.

The hinge unit 3 is coupled to the moving plate 2 at a first end portions 31, and coupled to the moving plate 2 (SIC: the frame unit 4 is correct) at a second end portion 32. Fillets 33 having a radius of curvature of 5 to 10 [μm], for example, are formed at the first end portion 31 and the second end portion 32. In addition, fillets 34 having a radius of curvature of several [μm], for example, are formed at coupling portions of the supporting rods 3a and the crosspieces 3b. The fillets 33, 34 are not limited to an arc shape (R-type shape) and they may be a linear shape (C-type shape).

Subsequently, manufacturing processes of the mirror device 1 are described. First, the first silicon layer 11a is processed by so-called micro machining technology such as lithography or etching to form shapes which will be the moving plate 2, the hinge units 3, the frame unit 4, and the perpendicular combs 5 (first process). At this time, the hinge units 3 are partially penetrated so that the honeycombed portions 3c are formed. Then, a metal film is formed on a top face of the silicon layer 11a of the SOI substrate 11 using a sputtering method, for example. By pattering the metal film, a mirror film 2a is formed on the top face of each the moving plate 2 and the electrode pads 7a, 7b are formed on the top face of each the frame unit 4.

Subsequently, the second silicon layer 2 is processed by bulk micro machining technology to form shapes which will be the frame unit 4, similarly (second process). After processing the first silicon layer 11a and the second silicon layer 11b, etching of the oxidation film 11c is performed. The etching is performed from below the mirror device 1, for example, so that the oxidation film 11c at portions other than the frame unit 4 is removed (third process). Thereby, it is a state that the hinge units 3 are transformable and the moving plate 2 is swingable.

After passing the first to third processes, a plurality of the mirror devices 1 are formed on the SOI substrate 11. After the third process, a plurality of the mirror devices 1 formed on the SOI substrate 11 is individually cut out. By these series of processes, a plurality of the mirror devices 1 are manufactured simultaneously, so that it is possible to decrease the manufacturing cost of the mirror devices 1. In addition, the manufacturing processes of the mirror device 1 are not limited to these, and it is possible to be formed by laser process, ultrasonic wave process or the like, and it may be formed one by one.

According to the above mirror device 1, since the hinge units 3 is formed as the ladder shape having the honeycomb portions 3c, it is possible to increase the tensional rigidity and the flexural rigidity of the hinge units 3 sufficiently by the supporting rods 3a and the crosspieces 3b while restraining the torsional rigidity of the hinge units 3 by honeycomb structure. Thereby, it is possible to increase response and stability of the swing motion of the moving plate 2, and thus, the mirror device 1 having good response and stability of the swing motion of the mirror can easily and inexpensively obtained, and it is possible to improve quality of images of an optical instrument. In addition, since the twin supporting rods 3a and the crosspieces 3b are formed in plane with the moving plate 2, the supporting rods 3a and the crosspieces 3b can be formed easily by removing the first silicon layer 11a corresponding to the honeycombed portions 3c simultaneously when removing the circumference of the moving plate 2 by dry etching or the like. Thereby, the mirror devices 1 can be obtained by the simple processes similar to those of the normal mirror devices conventionally exist, and it is possible to improve the quality of the image of the optical instrument inexpensively.

In addition, since the fillets 33 are formed at the first end portion 31 and the second end portion 32 of the hinge unit 3, it is possible to disperse stresses acting on the first end portion 31 and the second end portion 32. Thereby, in case of using the moving structure in a long time, it is possible to restrain occurrence of cracks in the first end portion 31 and the second end portion 32, and thus, durability of the hinge units 3 is enhanced. Similarly, since the filets 34 are formed at the coupling portions of the supporting rods 3a and the crosspieces 3b, it is possible to disperse stresses acting on the coupling portions. Thereby, in case of using the moving structure in a long time, it is possible to restrain occurrence of cracks in the above coupling portions, and thus, durability of the hinge units 3 is enhanced.

Figure 6:
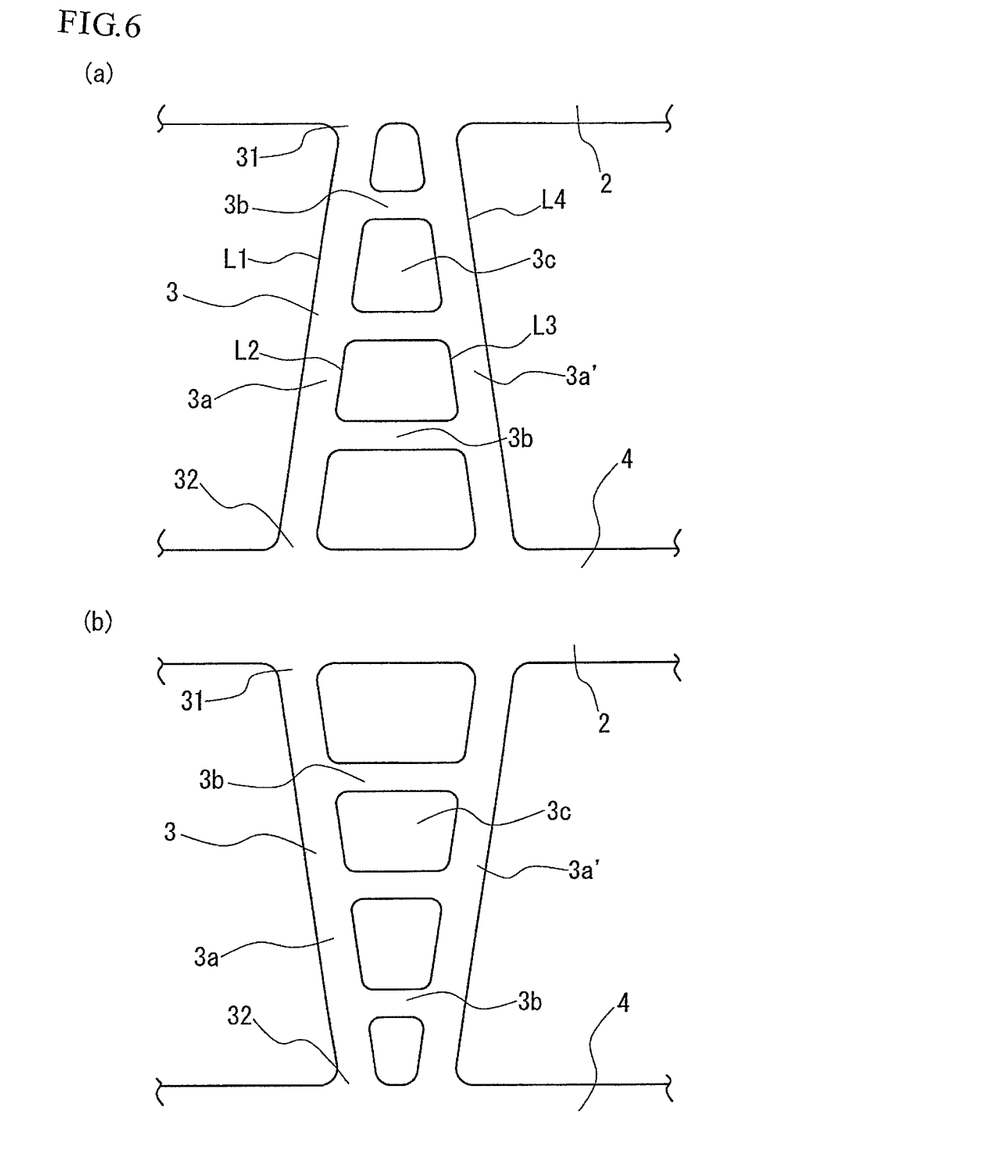
FIG. 6 is a plain view showing a modification of the hinge unit.

In addition, the present invention is not limited to the above mentioned configuration of the embodiment, and it is possible to modify in various manners properly within the scope not changing the purpose of the invention. As shown in FIG. 6, the supporting rod 3a and the supporting rod 3a' may be disposed not in parallel with each other in planar view, for example. FIG. 6(a) shows an example that a distance between the supporting rod 3a and the supporting rod 3a' at the first end portion 31 is set to be narrower than a distance between them at the second end portion 32, and FIG. 6(b) shows another example that the distance between the twin supporting rod 3a and the supporting rod 3a' at the first end portion 31 is set to be wider than the distance between them at the second end portion 32. In FIG. 6, the supporting rod 3a has a side L1 and a side L2 in planar view, and the supporting rod 3a' has a side L3 and a side 14 in planar view. Then, the side L1 and the side L2 of one supporting rod 3a are not parallel to the side L3 and the side L4 of the other supporting rod 3a' in planar view, respectively. In other words, one supporting rod 3a has no side parallel to the side L3 and the side L4 of the other supporting rod 3a' in planar view. In addition, although the side L1 and the side L2 of the supporting rod 3a are configured to be in parallel with each other in FIG. 6, they may be not in parallel with each other. The same goes for the side L3 and the side L4 of the supporting rod 3a'. Furthermore, although the supporting rods having a rectangular cross section are illustrated in FIG. 1 and FIG. 2, the supporting rods which constitute the hinge units 3 may have a round cross section, and in the latter case, the relations between the side L1 and the side L2, and the side L3 and the side L4 in planar view remain unchanged. According to the examples shown in FIG. 6, since the supporting rod 3a and the supporting rod 3a' are not arranged in parallel with each other, the flexural rigidity of the hinge units 3 can be increased in concentrative, and thus, it is possible to restraint vibrations of the moving plate 2 effectively in the in-plain translation mode or in the in-plain turn mode, for example.

Figure 7:
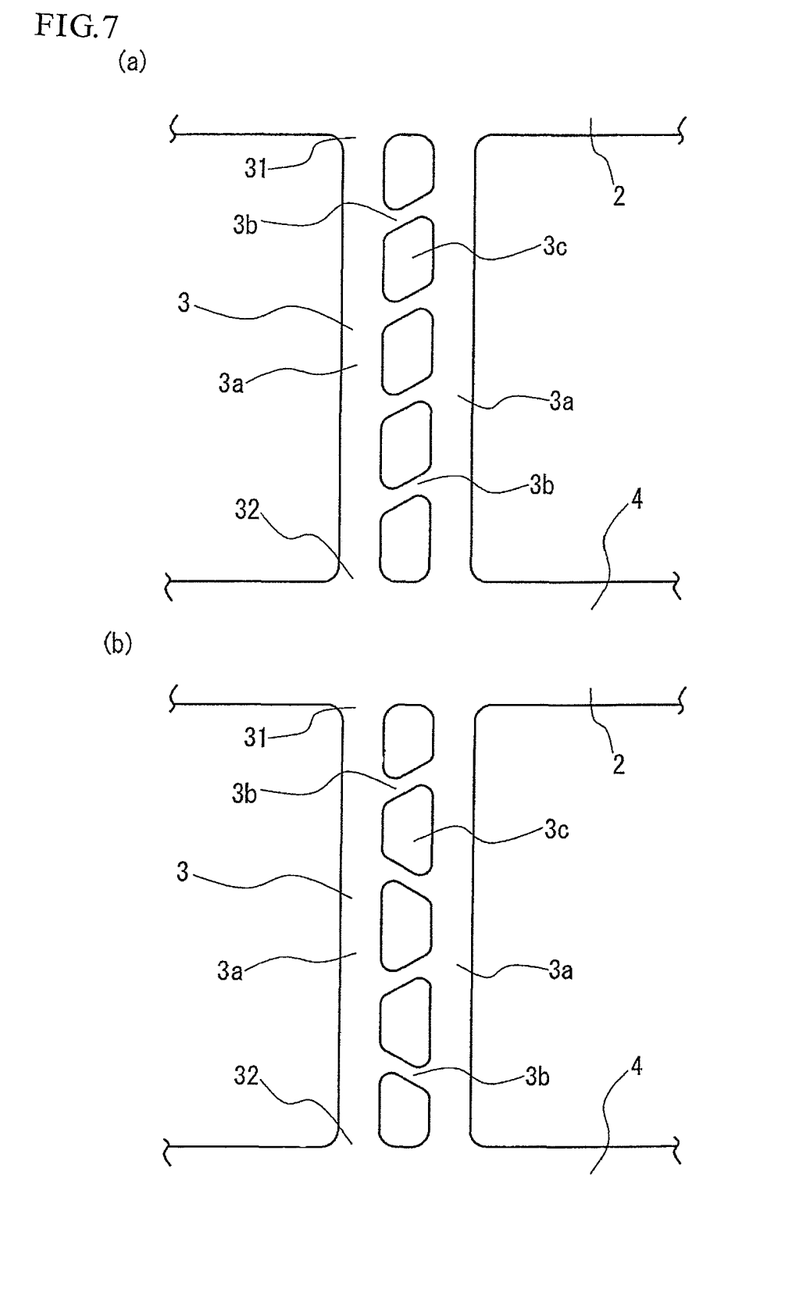
FIG. 7 is a plain view showing another modification of the hinge unit.
Figure 8:
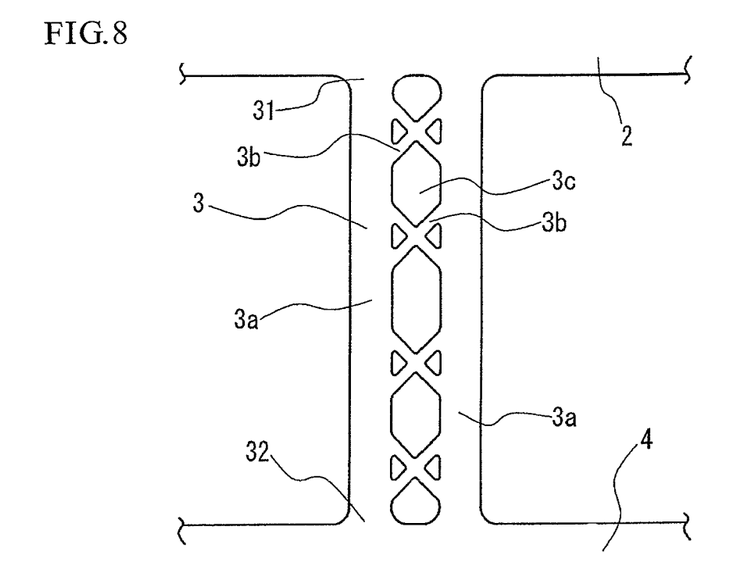
FIG. 8 is a plain view showing still another modification of the hinge unit.

Furthermore, it is possible to arrange the crosspieces 3b not perpendicular to the supporting rods 3a, as shown in FIG. 7 and FIG. 8. FIG. 7(a) shows an example that the crosspieces 3b are arranged in parallel with each other, and FIG. 7(b) shows another example that the crosspieces 3b are arranged symmetrical with each other about a virtual axis perpendicular to the supporting rods 3a. Still furthermore, FIG. 8 shows an example that two crosspieces 3b, which form a counterpart, are crossed and coupled at center portions of them. According to the examples shown in FIG. 7 and FIG. 8, since the crosspieces 3b are not arranged perpendicular to the supporting rods 3a, it is possible to increase the tensional rigidity of the hinge units 3 in concentrative, and thus, it is possible to restraint vibrations of the moving plate 2 in the modes other than the torsion mode. In addition, it is possible to form the hinge units 3 by combining the structures of the crosspieces 3b shown in FIG. 7 and FIG. 8 with the structures of the supporting rod 3a and the supporting rod 3a' shown in FIG. 6.

Figure 9:
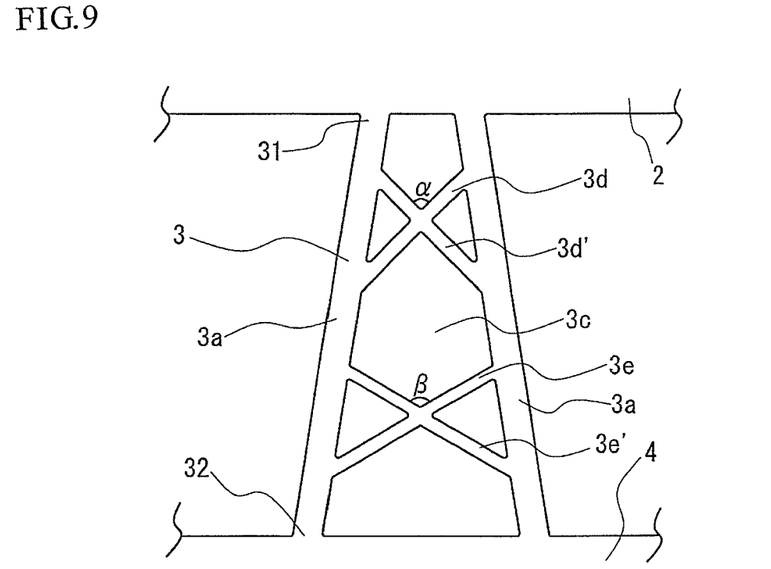
FIG. 9 is a plain view showing still another modification of the hinge unit.

Still furthermore, it is possible to configure the hinge units 3 by the twin supporting rods 3a, 3a' and a plurality of sets of the crosspieces 3d, 3d', 3e, 3e', . . . as shown in FIG. 9, for example (the figure shows the hinge unit having two sets of the crosspieces). The crosspiece 3d and the crosspiece 3d' which form a counterpart each other are crossed and coupled each other between the supporting rod 3a and the supporting rod 3a'. In addition, the crosspiece 3e and the crosspiece 3e' which form a counterpart each other are crossed and coupled each other between the supporting rod 3a and the supporting rod 3a'. Furthermore, an angle α that the crosspiece 3d crosses the crosspiece part 3d' is set to be different from another angle β that he crosspiece 3e crosses the crosspiece part 3e'. According to the example shown in FIG. 9, since the flexibility to design the hinge units 3 to have desired flexural rigidity and torsional rigidity, it is possible to restrain the vibrations of the moving plate 2 in the in-plane translation mode and in the in-plane turn mode effectively, for example.

Figure 10:
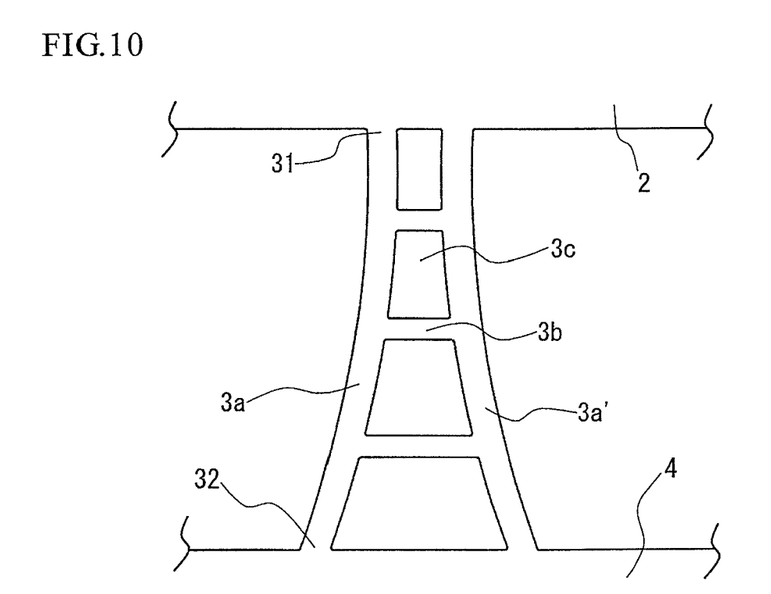
FIG. 10 is a plain view showing still another modification of the hinge unit.

Still furthermore, it is possible to form the twin supporting rods 3a, 3a' as curves as shown in FIG. 10, for example. In particular, the supporting rods 3a, 3a' are formed as catenary curves. According to the example shown in FIG. 10, it is possible to distribute the stress acting on the supporting rods 3a, 3a' more evenly, so that the durability of the hinge units 3 can be increased moreover. In addition, it is possible to configure the hinge units 3 by combining the supporting rods 3a, 3a' shown in FIG. 10 with the crosspieces 3d, 3d', 3e, 3e', . . . shown in FIG. 9.

In addition, the hinge units and the electrodes constituting the perpendicular combs may be formed on the second silicon layer, or they may be configured of a single silicon substrate other than the SOI substrate, or they may be configured of another semiconductor or metal plate. Furthermore, the moving structure may be configured to have flat combs or driving electrodes which are arranged to face a plane of the moving plate replacing with the perpendicular combs, and to drive the moving plate using electrostatic forces generated by them as driving forces. Then, the moving structure may have a driving structure to drive the moving plate by magnetic forces, electrostriction forces, heat-striction forces, for example. The present invention is not limited to one suitable for the structure of the light scanning mirror device, but it may be applicable widely to a moving structure which pivots a moving plate swingably by hinge units such as an acceleration sensor, for example.

LIST OF MARKS

1: light scanning mirror device (moving structure)
2: moving plate
2a: mirror film (mirror)
3: hinge units
4: frame unit
5: perpendicular combs (comb tooth electrodes)
3a, 3a': supporting rods
3b, 3b': crosspieces
3d, 3d': crosspieces
3e, 3e': crosspieces

The invention claimed is:
1. A moving structure, comprising:
a moving plate;
beam shaped hinge units which pivot the moving plate swingably; and
a frame unit which supports the hinge units, wherein each of the hinge units has a ladder shape having twin supporting rods and crosspieces bridged between the twin supporting rods,
the twin supporting rods which are bridged by the crosspieces are not disposed in parallel with each other in a planar view, and
an outer side and an inner side of each of the twin supporting rods are parallel with each other.

2. The moving structure in accordance with claim 1, wherein the twin supporting rods have no sides disposed in parallel with each other in planar view.

3. The moving structure in accordance with claim 1, wherein upper faces and lower faces of the twin supporting rods and the crosspieces in thickness direction are respectively formed on the same levels as those of the moving plate.

4. A micro-mirror device comprising the moving structure described in claim 3, and characterized in that
the moving plate has a mirror for reflecting light, and
electrodes for driving the moving plate swingably are provided on a part of the moving plate and a portion of the frame unit facing it to be perpendicular to the moving plate and in parallel with each other.

5. The moving structure in accordance with claim 1, wherein the crosspieces are not disposed perpendicular to the supporting rods.

6. The moving structure in accordance with claim 1, wherein each of the hinge units has a first end portion coupled to the moving plate and a second end portion coupled to the frame unit, and fillets are formed at coupling corners of the first end portion and the moving plate and at coupling corners of the supporting rods and the frame unit.

7. The moving structure in accordance with claim 1, wherein fillets are formed at coupling corners of the supporting rods and the crosspieces.

8. The moving structure in accordance with claim 1, wherein each of the hinge units has a set of crosspieces, and the crosspieces are crossed and coupled each other between the twin support rods.

9. The moving structure in accordance with claim 8, wherein each of the hinge units has a plurality of sets of crosspieces, and each set of the crosspieces cross at an angle different each other.

10. The moving structure in accordance with claim 1, wherein the twin supporting rods are curved lines.

11. The moving structure in accordance with claim 10, wherein the curved lines are catenary curves.

12. A micro-mirror device comprising the moving structure described in claim 1, and characterized in that
the moving plate has a mirror for reflecting light, and
electrodes for driving the moving plate swingably are provided on a mirror portion of the moving plate and a portion of the frame unit facing it.

13. A moving structure comprising:
a moving plate;
beam shaped hinges which pivot the moving plate swingably; and
a frame which supports the hinges, wherein
each of the hinges has a ladder shape having twin supporting rods and crosspieces bridged between the twin supporting rods,
the twin supporting rods are not disposed in parallel with each other in a planar view, and
each of the hinges has a set of crosspieces, and the crosspieces are crossed and coupled to each other between the twin support rods.

14. A moving structure comprising:
a moving plate;
beam shaped hinges which pivot the moving plate swingably; and
a frame which supports the hinges, wherein
each of the hinges has a ladder shape having twin supporting rods and crosspieces bridged between the twin supporting rods,
the twin supporting rods are not disposed in parallel with each other in a planar view, and
the twin supporting rods are curved lines.

* * * * *